US012598967B2

(12) United States Patent
Li et al.

(10) Patent No.: US 12,598,967 B2
(45) Date of Patent: Apr. 7, 2026

(54) THROUGH SILICON VIA INTERCONNECTION STRUCTURE AND METHOD OF FORMING SAME, AND QUANTUM COMPUTING DEVICE

(71) Applicant: Tencent Technology (Shenzhen) Company Limited, Shenzhen (CN)

(72) Inventors: Dengfeng Li, Shenzhen (CN); Wenlong Zhang, Shenzhen (CN); Kunliang Bu, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 395 days.

(21) Appl. No.: 18/202,458

(22) Filed: May 26, 2023

(65) Prior Publication Data

US 2023/0307297 A1 Sep. 28, 2023

Related U.S. Application Data

(63) Continuation of application No. PCT/CN2022/127764, filed on Oct. 26, 2022.

(30) Foreign Application Priority Data

Dec. 28, 2021 (CN) .......................... 202111624032.5

(51) Int. Cl.
*H10W 20/00* (2026.01)
*B81B 7/00* (2006.01)
(Continued)

(52) U.S. Cl.
CPC ......... *H10W 20/023* (2026.01); *H10W 20/20* (2026.01)

(58) Field of Classification Search
CPC ............. H01L 21/76898; H01L 23/481; H01L 2224/02372; H01L 2224/02375;
(Continued)

(56) References Cited

U.S. PATENT DOCUMENTS 10,685,935 B2 6/2020 Chen et al.
10,811,382 B1 10/2020 Wu et al.
(Continued)

FOREIGN PATENT DOCUMENTS

CN 105405781 3/2016
CN 107564868 1/2018

OTHER PUBLICATIONS

International Search Report issued Jan. 16, 2023 in International (PCT) Application No. PCT/CN2022/127764.
(Continued)

*Primary Examiner* — Herve-Louis Y Assouman
(74) *Attorney, Agent, or Firm* — Crowell & Moring LLP

(57) ABSTRACT

A through silicon via interconnection structure and a method of forming same, and a quantum computing device are provided. The method includes: providing a silicon wafer, having a first surface and a second surface opposite to each other; forming, in the silicon wafer, a through silicon via penetrating through the silicon wafer in a direction from the first surface to the second surface of the silicon wafer; forming a groove communicating with the through silicon via in a target surface of the first surface and the second surface of the silicon wafer using a photolithography process; and forming a superconducting thin film in the groove and the through silicon via to obtain the through silicon via interconnection structure.

19 Claims, 7 Drawing Sheets

(51) Int. Cl.

| | |
|---|---|
| *H10N 60/01* | (2023.01) |
| *H10N 69/00* | (2026.01) |
| *H10W 20/20* | (2026.01) |

(58) Field of Classification Search

CPC ... H01L 21/60; H01L 23/31; H01L 23/53285;
H01L 23/535; H01L 25/0657; B81B 7/00;
H10N 60/01; H10N 60/0241; H10N
60/82; H10N 69/00

See application file for complete search history.

(56) References Cited

U.S. PATENT DOCUMENTS

| | | | |
|---|---|---|---|
| 2018/0013052 A1* | 1/2018 | Oliver | H10N 60/805 |
| 2020/0176267 A1* | 6/2020 | Hsiao | H01L 23/5226 |
| 2020/0343434 A1* | 10/2020 | Rubin | H01L 23/53285 |
| 2021/0087053 A1 | 3/2021 | Weidner et al. | |

OTHER PUBLICATIONS

Extended European Search Report issued in European application
No. 22913739.3, dated Jan. 9, 2025, 10 opages.

* cited by examiner

Silicon wafer

Titanium nitride thin film

Titanium nitride thin film is etched

K0

Silicon wafer

Aluminum film is etched

Aluminum film

K0

First surface

01

Second surface

Top view                    Sectional view

Top view

Sectional view 02 on a surface of 01

02 on a side wall of C0

02 at a bottom of C0                    02 in K0

K0

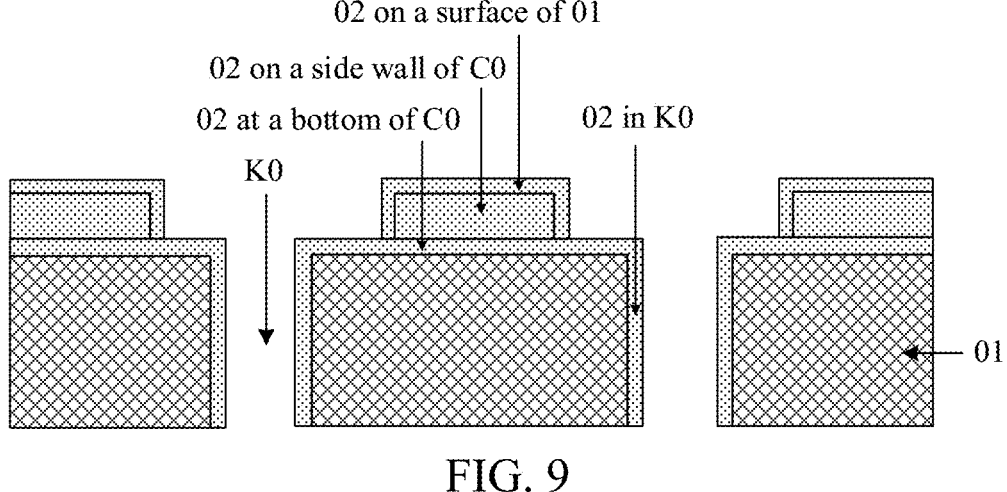

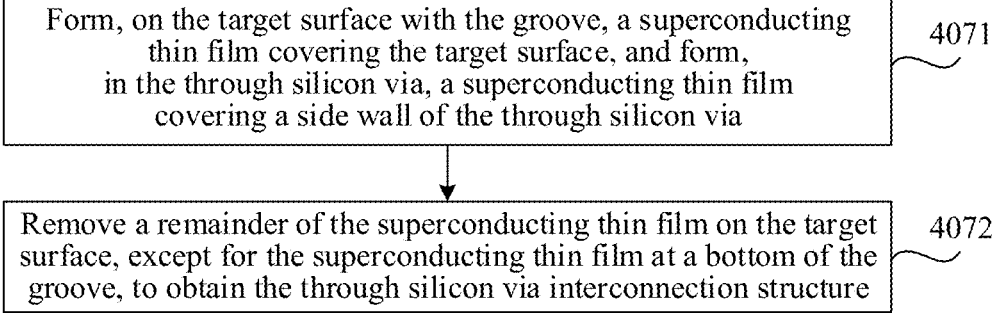

| Form, on the target surface with the groove, a superconducting thin film covering the target surface, and form, in the through silicon via, a superconducting thin film covering a side wall of the through silicon via | 4071 |

| Remove a remainder of the superconducting thin film on the target surface, except for the superconducting thin film at a bottom of the groove, to obtain the through silicon via interconnection structure | 4072 |

FIG. 10

THROUGH SILICON VIA INTERCONNECTION STRUCTURE AND METHOD OF FORMING SAME, AND QUANTUM COMPUTING DEVICE

RELATED APPLICATION

This application is a continuation application of PCT Patent Application No. PCT/CN2022/127764, filed on Oct. 26, 2022, which claims priority to Chinese Patent Application No. 202111624032.5, filed with the China National Intellectual Property Administration on Dec. 28, 2021, and entitled "THROUGH SILICON VIA INTERCONNECTION STRUCTURE AND METHOD OF PREPARING SAME, AND QUANTUM COMPUTING DEVICE", wherein the content of the above-referenced applications is incorporated herein by reference in its entirety.

FIELD OF THE TECHNOLOGY

This disclosure relates to the technical field of superconducting quantum, and in particular, to a through silicon via interconnection structure and a method of forming same, and a quantum computing device.

BACKGROUND OF THE DISCLOSURE

A through silicon via interconnection structure is a structure used for interconnecting chips located in different layers. The through silicon via interconnection structure usually includes: a silicon wafer with a Through Silicon Via (TSV), a superconducting thin film located inside the TSV, and a circuit structure located on a side with an opening of the TSV and connected to the superconducting thin film inside the TSV.

In related technologies, the through silicon via interconnection structure is usually formed by the following method: first, forming, in a silicon wafer, a through silicon via penetrating through the silicon wafer; then, forming superconducting thin films in a surface of the silicon wafer and in the through silicon via by using an Atomic Layer Deposition (ALD) process or a Chemical Vapor Deposition (CVD) process; and finally, etching the superconducting thin film formed in the surface of the silicon wafer using a photolithography process to form a pattern that is the same as a desired circuit structure, the pattern being connected to the superconducting thin film inside the through silicon via. The photolithography process includes: a series of processes including spin coating, exposure, development, and etching.

SUMMARY

Embodiments of this disclosure provide a through silicon via interconnection structure and a method of forming same, and a quantum computing device, which can solve the problems in the related technology that a superconducting thin film formed in a surface of a silicon wafer and used for forming a circuit structure cannot be reliably connected to a superconducting thin film inside a through silicon via. The technical solutions are as follows:

In one aspect, a method of forming a through silicon via interconnection structure is provided, the method including:

providing a silicon wafer, having a first surface and a second surface opposite to each other;

forming, in the silicon wafer, a through silicon via penetrating through the silicon wafer in a direction from the first surface to the second surface of the silicon wafer;

forming a groove communicating with the through silicon via in a target surface of the first surface and the second surface of the silicon wafer using a photolithography process; and forming a superconducting thin film in the groove and the through silicon via to obtain the through silicon via interconnection structure.

In another aspect, a through silicon via interconnection structure is provided. The through silicon via interconnection structure may be formed by the above-mentioned method. The through silicon via interconnection structure includes:

a silicon wafer, having a first surface and a second surface opposite to each other;

a through silicon via, penetrating through the silicon wafer in a direction from the first surface to the second surface of the silicon wafer; and a superconducting thin film located in a groove in a target surface of the first surface and the second surface of the silicon wafer, and located in the through silicon via.

According to still another aspect, a quantum computing device is provided, including: a first chip, a second chip, and a through silicon via interconnection structure. The through silicon via interconnection structure may include:

a silicon wafer, having a first surface and a second surface opposite to each other;

a through silicon via, penetrating through the silicon wafer in a direction from the first surface to the second surface of the silicon wafer; and a superconducting thin film located in a groove in a target surface of the first surface and the second surface of the silicon wafer, and located in the through silicon via; and the first chip, the through silicon via interconnection structure, and the second chip being stacked in sequence, and the first chip and the second chip may be interconnected through the through silicon via interconnection structure.

To sum up, the embodiments of this disclosure provide a through silicon via interconnection structure and a method of forming same. The method includes: forming, in any surface of a silicon wafer with a through silicon via, a groove communicating with the through silicon via by using a photolithography process; and then forming superconducting thin films in the groove and the through silicon via, to obtain a through silicon via interconnection structure. Due to the fact that the method can first use the photolithography process to form the groove communicating with the through silicon via, and then form the superconducting thin film in the groove, there is no need to perform photolithography on the superconducting thin film subsequently. In this way, the problem that the superconducting thin film near the through silicon via is etched away because of a poor spin coating effect in the photolithography process can be avoided, thus ensuring that the superconducting thin film on the surface of the silicon wafer and used for forming a circuit structure is reliably connected to the superconducting thin film in the through silicon via.

BRIEF DESCRIPTION OF THE DRAWINGS

FIG. 9 is a schematic structural diagram of a silicon wafer with a superconducting thin film according to an embodiment of this disclosure.

FIG. 10 is a flowchart of a method of forming a superconducting thin film to obtain a through silicon via interconnection structure according to an embodiment of this disclosure.

ILLUSTRATIONS OF ALL THE NUMERALS IN THE DRAWINGS ARE AS FOLLOWS

Figure 1:
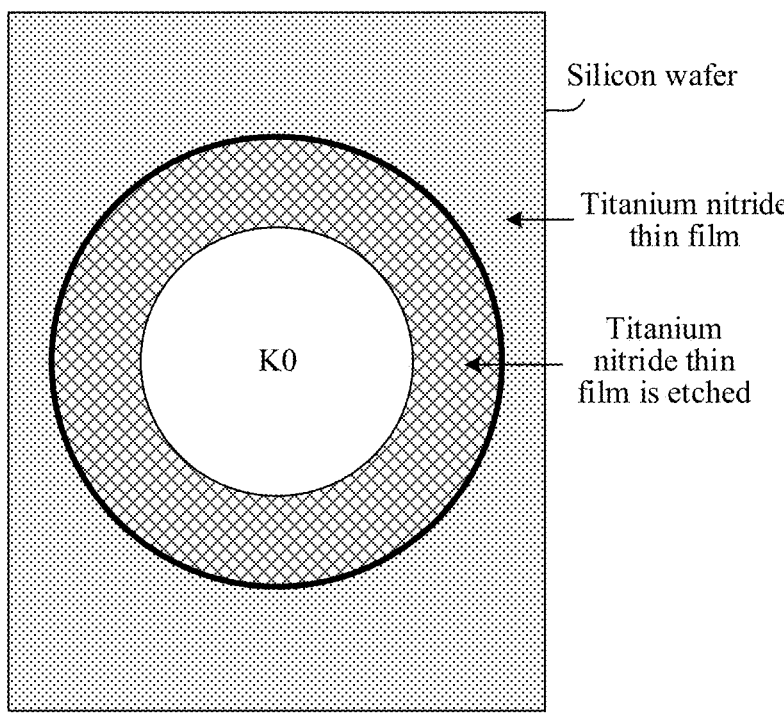
FIG. 1 is a schematic diagram of a silicon wafer where a titanium nitride thin film near a through silicon via is etched according to an embodiment of this disclosure.

00: through silicon via interconnection structure;
01: silicon wafer; 02: superconducting thin film; K0: through silicon via; C0: groove; M0: photoresist pattern;
20: first chip; and 30: second chip.

DESCRIPTION OF EMBODIMENTS

When forming a through silicon via interconnection structure by the scheme in the related technology, a superconducting thin film filling a through silicon via is relatively thin due to the limitation of an Atomic Layer deposition (ALD) processor or a Chemical Vapor Deposition (CVD) process. Moreover, when a spin coating process is used to perform spin coating on a surface of a silicon wafer, reliable spin coating may not be achieved near the through silicon via. As a result, a superconducting thin film near the through silicon via is etched away in an etching process. Based on the above reasons, it may lead to a failure in connection between a pattern (namely, a superconducting thin film used for forming the circuit structure) formed by a photolithography process and the same as a circuit structure and the superconducting thin film in the through silicon via.

For convenience of understanding, before elaboration of the technical solution of the embodiments of this disclosure, the terms involved in the embodiments of this disclosure will be explained first:

Dry etching: A plasma is used to etch a substrate (for example, a silicon wafer) or a thin film (for example, a superconducting thin film formed on a surface of silicon wafer).

CVD process: It is technology in which various gas components undergo chemical reactions on a surface of a substrate and then are attached on the substrate to form a thin film.

ALD process: It is a technology of coating a substance on a surface of a substrate layer by layer in the form of a single atomic film.

Through silicon via (TSV) interposer: It is a silicon wafer with a TSV. The TSV is filled with a conducting material. In a process of stacking several chips layer by layer, the TSV interposer may be used to interconnect the multiple chips on different layers above and below, so as to achieve three-dimensional integration of the chips with different functions. Correspondingly, the TSV interposer may also be referred to as a TSV interconnection structure. The conducting material may be divided into a non-superconducting material without superconductivity and a superconducting material with superconductivity. Common non-superconducting materials include copper. Common superconducting materials include aluminum, niobium, tantalum, titanium nitride, and the like. The non-superconducting materials are generally used in the technical field of semiconductors, while the superconducting materials are generally used in the technical field of superconducting quantum.

In the technical field of semiconductors, the TSV interposer is usually formed using following steps: first etching a silicon wafer to form a through silicon via penetrating through the silicon wafer by using a deep silicon etching process; then depositing an insulation layer and a seed layer in the through silicon via in sequence; and finally, filling the through silicon via with a conducting material (for example, copper) by electroplating to form a conducting thin film, and connecting the conducting thin film to a circuit structure formed on a surface of the silicon wafer. In the technical field of superconducting quantum, the TSV interposer is usually formed using a manner recorded in the background section, and the superconducting thin film formed on the surface of the silicon wafer is generally relatively thin. For example, the thickness is generally about 100 nanometers (nm) to 200 nm. This results in unreliable spin coating near the through silicon via, which means that the spin coating effect is poor. As a result, the superconducting thin film near the through silicon via is easily etched away in the etching process, ultimately resulting in a failure in connection between a superconducting pattern used for forming a circuit structure and a superconducting thin film in the through silicon via.

Figure 2:
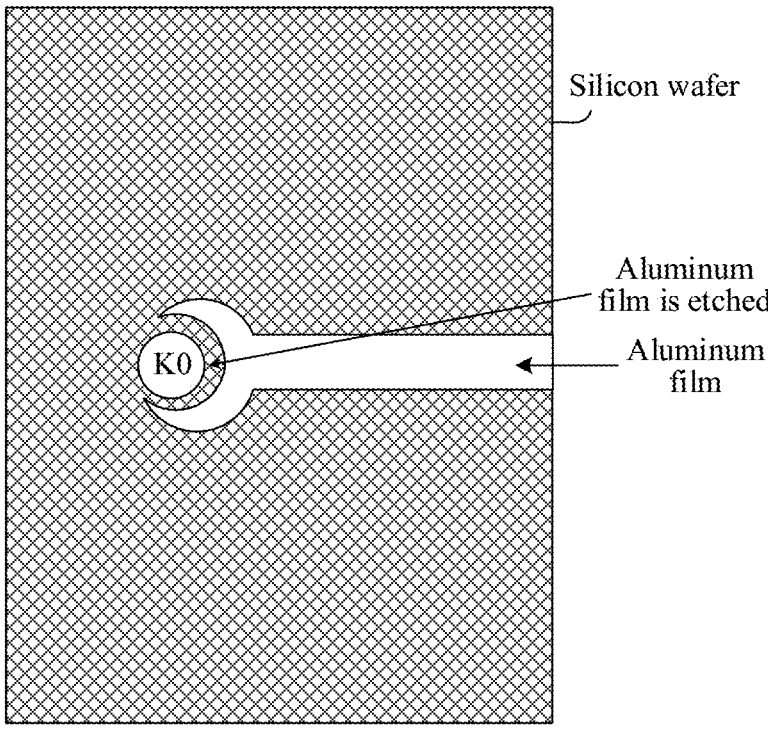
FIG. 2 is a schematic diagram of a silicon wafer where an aluminum film near a through silicon via is etched according to an embodiment of this disclosure.

For example, referring to FIG. 1, a titanium nitride material serving as a superconducting material is taken as an example, that is, a titanium nitride thin film serves as a superconducting thin film, showing a phenomenon that the titanium nitride thin film is etched away because of a poor spin coating effect near a through silicon via. Referring to FIG. 2, aluminum serving as a superconducting material is taken as an example, that is, an aluminum film is used as a superconducting thin film, showing a phenomenon that the aluminum film is etched away because of a poor spin coating effect near a through silicon via. K0 represents a through silicon via in both FIG. 1 and FIG. 2.

In response to the phenomena shown in FIG. 1 and FIG. 2, a lift-off process is often used for subsequent treatment after a superconducting thin film is formed on a surface of a silicon wafer. That is, first, the superconducting thin film formed on the surface of the silicon wafer is removed by polishing or dry etching. Then, operations such as spin coating, exposure, and development are performed in sequence on the surface of the silicon wafer on the basis of a shape and size of a desired circuit structure, to obtain a desired pattern. Next, a superconducting thin film with a thickness of about 100 nm is deposited on the surface of the silicon wafer by electron beam evaporation. Finally, a photoresist is removed to obtain a superconducting pattern used for forming the circuit structure.

Based on the above treatment method, although the spin coating effect near the through silicon via is poor, it does not affect the deposition of the superconducting thin film in this process step. However, there are at least two problems with this treatment method: Firstly, during the development, a developer inevitably enters the through silicon via. It is impossible to determine whether the developer in the through silicon via has been cleaned after the through silicon via is cleaned, resulting in impurities between the superconducting thin film on the surface of the silicon wafer and a superconducting thin film in the through silicon via. Secondly, during the treatment, an oxide layer will be formed on a surface of the superconducting thin film in the through silicon via when the superconducting thin film is in contact with air, resulting in an increase in resistance between the superconducting thin film on the surface of the silicon wafer and the superconducting thin film in the through silicon via. The above problems will affect the superconductivity of the superconducting thin films, leading to unreliable connections between various stacked chips, and ultimately resulting in relatively low signal transmission reliability between the chips. For example, the problems lead to a poor signal transmission effect of a superconducting quantum chip in quantum computing.

Figure 3:
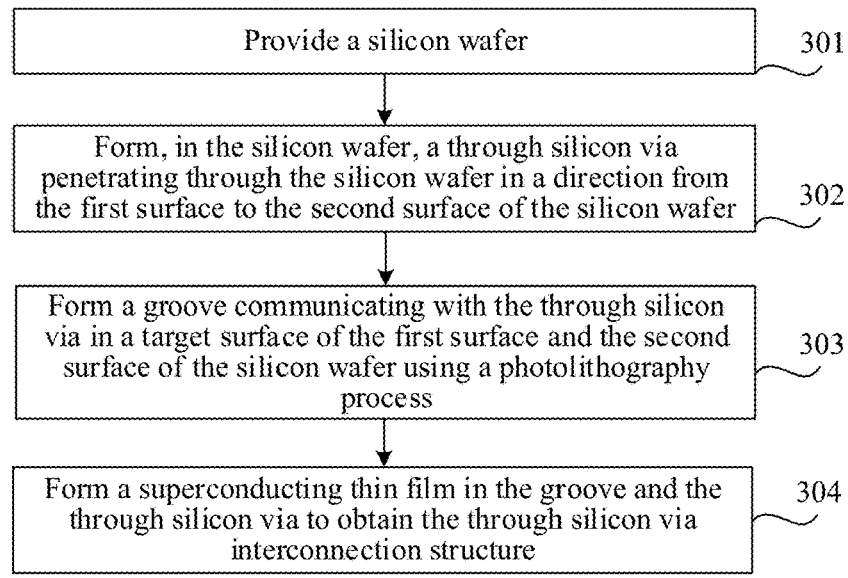
FIG. 3 is a flowchart of a method of forming a through silicon via interconnection structure according to an embodiment of this disclosure.

In response to the above problems, the embodiments of this disclosure provide a new method of forming a through silicon via interconnection structure. The method can be applied to a device of forming a through silicon via interconnection structure. In the through silicon via interconnection structure formed by the method, there may be no impurities and oxide layers between a superconducting thin film on a surface of a silicon wafer to form a circuit structure and a superconducting thin film in a through silicon via. Thus, the circuit structure finally formed on the surface of the silicon wafer may be reliably connected to the superconducting thin film in the through silicon via, so that the signal transmission reliability is relatively good. FIG. 3 is a flow chart of a method of forming a through silicon via interconnection structure provided according to an embodiment of this disclosure. As shown in FIG. 3, the method includes:

Step 301. Provide a silicon wafer.

The silicon wafer provided has a first surface and a second surface opposite to each other.

Step 302. Form, in the silicon wafer, a through silicon via penetrating through the silicon wafer in a direction from the first surface to the second surface of the silicon wafer.

In an implementation, a deep silicon etching process may be used to etch the silicon wafer in the direction from the first surface to the second surface of the silicon wafer, to form the through silicon via penetrating through the silicon wafer.

Step 303. Form a groove communicating with the through silicon via in a target surface of the first surface and the second surface of the silicon wafer by using a photolithography process.

In an implementation, the photolithography process generally includes process operations such as spin coating, exposure, development, and etching performed in sequence. That is, after the through silicon via is formed in the silicon wafer, the above operations such as spin coating, exposure, development, and etching can be further performed on the first surface and/or the second surface of the silicon wafer in order to form the groove communicated to the through silicon via. The circuit structure is formed in the groove, or it can be understood as follows: The groove is used for defining a region where the circuit structure is located. It can be seen that a shape and size of the groove are the same as a shape and size of the circuit structure to be formed.

Step 304. Form superconducting thin films in the groove and the through silicon via to obtain the through silicon via interconnection structure.

In an implementation, after the groove communicating with the through silicon via is formed, superconducting materials may be synchronously deposited in the groove and through silicon via through an ALD or a CVD process to form the superconducting thin films, thereby obtaining the desired through silicon via interconnection structure, namely, a TSV interposer. The superconducting thin film located in the groove may be used for forming a circuit structure. In this way, reliable connection between the circuit structure on the surface of the silicon wafer and the superconducting thin film in the through silicon via is achieved.

It can be understood that the device of forming the through silicon via interconnection structure may include an etching device, a photolithography device, a film forming device, and the like. The film forming device may be an ALD device, a CVD device, or the like.

To sum up, this embodiment of this disclosure provides a method of forming a through silicon via interconnection structure. The method includes: forming, in any surface of a silicon wafer with a through silicon via, a groove communicating with the through silicon via by using a photolithography process; and then forming superconducting thin films in the groove and the through silicon via, to obtain a through silicon via interconnection structure. Due to the fact that the method can first use the photolithography process to form the groove communicating with the through silicon via, and then form the superconducting thin film in the groove, there is no need to perform photolithography on the superconducting thin film subsequently. In this way, the problem that the superconducting thin film near the through silicon via is etched away because of a poor spin coating effect in the photolithography process can be avoided, thus ensuring that the superconducting thin film on the surface of the silicon wafer and used for forming a circuit structure is reliably connected to the superconducting thin film in the through silicon via.

Figure 4:
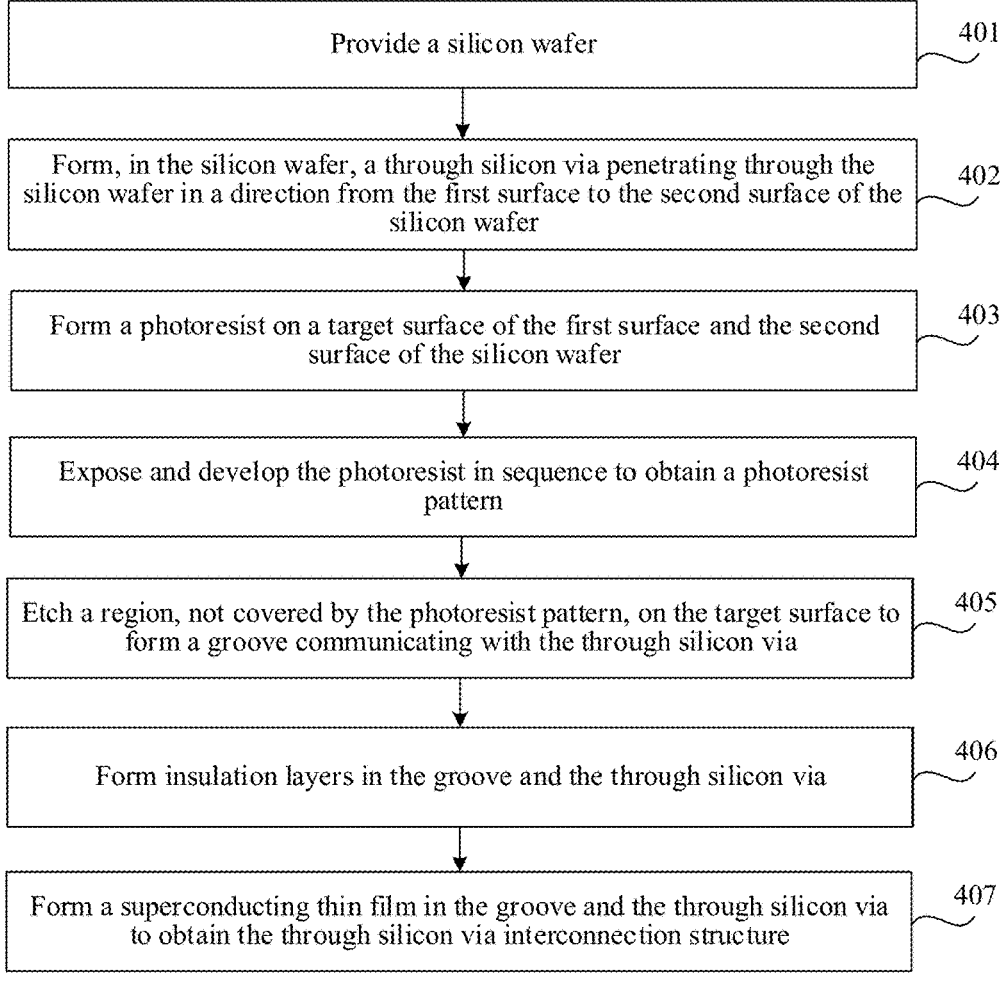
FIG. 4 is a flowchart of a method of forming a through silicon via interconnection structure according to an embodiment of this disclosure.

FIG. 4 is a flowchart of a method of forming a through silicon via interconnection structure according to an embodiment of this disclosure. The method can be applied to a device of forming a through silicon via interconnection structure. As shown in FIG. 4, the method includes:

Step 401. Provide a silicon wafer.

Figure 5:
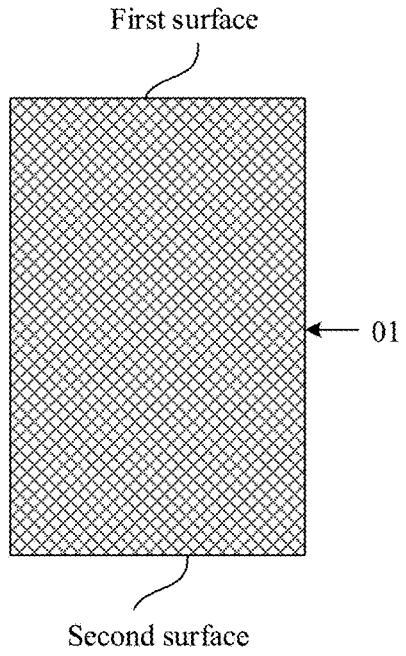
FIG. 5 is a schematic structural diagram of a silicon wafer according to an embodiment of this disclosure.

For example, FIG. 5 shows a sectional view of the silicon wafer provided. Referring to FIG. 5, it can be seen that the silicon wafer 01 may have a first surface and a second surface opposite to each other. The first surface and the second surface may be parallel to each other. Moreover, for FIG. 5, the first surface may be an upper surface of the silicon wafer 01, and the second surface may be a lower surface of the silicon wafer 01. Of course, in some other embodiments, the first surface may also be a lower surface of the silicon wafer 01, and the second surface may be an upper surface of the silicon wafer 01. In addition, the silicon wafer 01 provided in this embodiment of this disclosure may also be referred to as a silicon substrate.

Step 402. Form, in the silicon wafer, a through silicon via penetrating through the silicon wafer in a direction from the first surface to the second surface of the silicon wafer.

According to FIG. 5, in this embodiment of this disclosure, a deep silicon etching process (also referred to as a TSV technology) can be used to etch the silicon wafer 01 in the direction from the first surface to the second surface of the silicon wafer 01 to form the through silicon via K0 penetrating through the silicon wafer 01. Correspondingly, the first surface and the second surface may also be referred to as surfaces on sides where openings of the through silicon via K0 are located.

Figure 6:
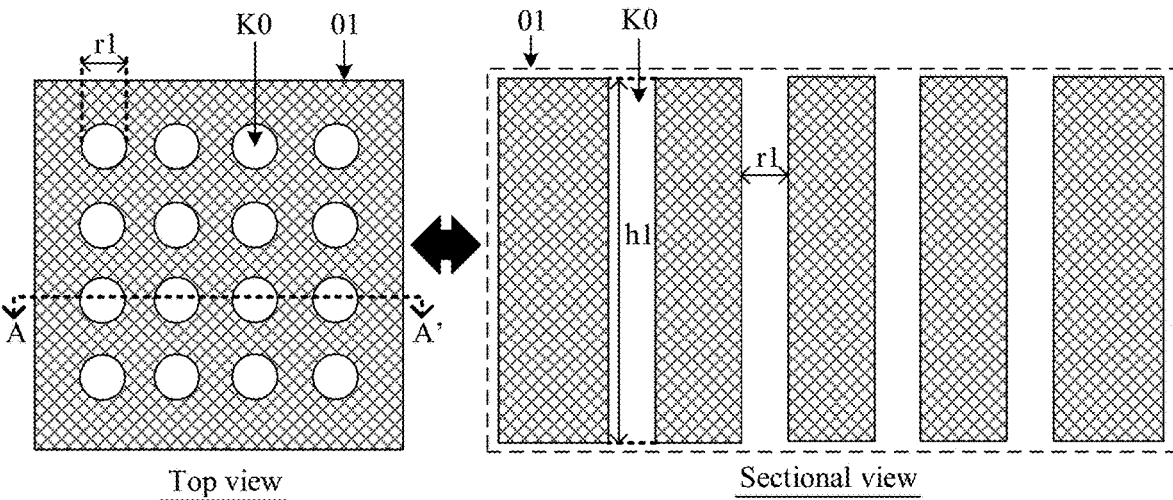
FIG. 6 is a schematic structural diagram of a silicon wafer with a through silicon via according to an embodiment of this disclosure.

For example, FIG. 6 shows a schematic structural diagram of a silicon wafer etched with a through silicon via, including a top view (referring to the left figure of the arrow in FIG. 6) and a sectional view of the top view in a direction AA' (referring to the right figure of the arrow in FIG. 6). According to FIG. 6, it can be seen that a pore size r1 of the through silicon via K0 formed in the silicon wafer 01 may be about 10 microns (μm) to 40 μm, for example, 20 μm. A depth h1 of the through silicon via K0 formed in silicon wafer 01 may be about 200 μm. In other words, a thickness of the silicon wafer 01 can be about 200 μm. Moreover, an angle between a side wall of the formed through silicon via K0 and a silicon plane (namely, the first surface and the second surface of the silicon wafer 01) may be about 90±1 degrees (°), indicating that the side wall of the through silicon via K0 may be relatively perpendicular to the silicon plane. The side wall of the through silicon via K0 shown in FIG. 6 is perpendicular to the silicon plane.

It can be understood that referring to FIG. 6, it can be seen that a plurality of through silicon vias K0 penetrating through the silicon wafer 01 may be formed in one silicon wafer 01, and the formed through silicon vias K0 may be arranged at equal intervals. Of course, in other embodiments, a plurality of through silicon vias K0 formed in one silicon wafer 01 may be arranged arbitrarily, namely, at non-equal intervals. Or, only one through silicon via K0 penetrating through the silicon wafer 01 may be formed in the silicon wafer 01. This embodiment of this disclosure does not limit a quantity and arrangement of the through silicon via K0 formed in the silicon wafer 01.

Step 403. Form a photoresist on a target surface of the first surface and the second surface of the silicon wafer.

In an implementation, in combination with FIG. 6, after the through silicon via K0 penetrating through the silicon wafer 01 is formed in the silicon wafer 01, the photoresist can be uniformly applied to the target surface of the first surface and the second surface of the silicon wafer 01 by spin coating. The target surface may be at least one of the first surface and the second surface. That is, the photoresist may be formed on the first surface and/or the second surface of the silicon wafer 01. The process of applying the photoresist may also be referred to as spin coating.

It can be understood that if the target surface includes the first surface and the second surface, the photoresist may be simultaneously formed on both the first surface and the second surface of the silicon wafer 01, or the photoresist may be formed on the first surface and the second surface of the silicon wafer 01 in sequence. Similarly, the subsequent steps can be carried out simultaneously or in sequence on both the first surface and the second surface. In addition, due to process limitations, it is generally not possible to form a photoresist near the through silicon via K0 (namely, around the through silicon via K0).

In an implementation, the photoresist formed on the target surface may be either positive or negative. The positive photoresist refers to a photoresist in which an exposed portion will be dissolved in a developer during subsequent exposure and development, while an unexposed portion is insoluble in the developer. That is, the unexposed portion of the positive photoresist may be retained after development. The negative photoresist is on the contrary, which will not be repeated.

For example, the photoresist applied to the silicon wafer 01 in this embodiment of this disclosure may be a photoresist S1805 or a photoresist AZ6112. For the photoresist S1805, a coating thickness may be about 500 nm. For the photoresist AZ6112, a coating thickness may be about 1 μm.

Step 404. Expose and develop the photoresist in sequence to obtain a photoresist pattern.

In an implementation, after the photoresist is formed, the coated photoresist may be exposed by ultraviolet exposure (namely, UV exposure) or laser direct writing (namely, laser point-by-point scanning), to expose the desired pattern. A pattern of an exposed region of the positive photoresist may be the same as a pattern of the final desired circuit structure, in shape and size. A pattern of an unexposed region of the negative photoresist may be the same as the pattern of the final desired circuit structure.

The exposed photoresist may be developed to obtain the photoresist pattern. The development refers to: A product that needs to be developed (namely, the silicon wafer 01 coated with the photoresist) is put into a developer, so that a photoresist in an exposed region of a positive photoresist or a photoresist in a non-exposed region of a negative photoresist is dissolved in the developer, to form a photoresist pattern on the photoresist.

In an implementation, to ensure the stability of the formed photoresist pattern, the photoresist pattern may also be fixed after the development. The fixing refers to: The product that has been developed is put into a fixing solution to further fix the developed photoresist pattern.

Figure 7:
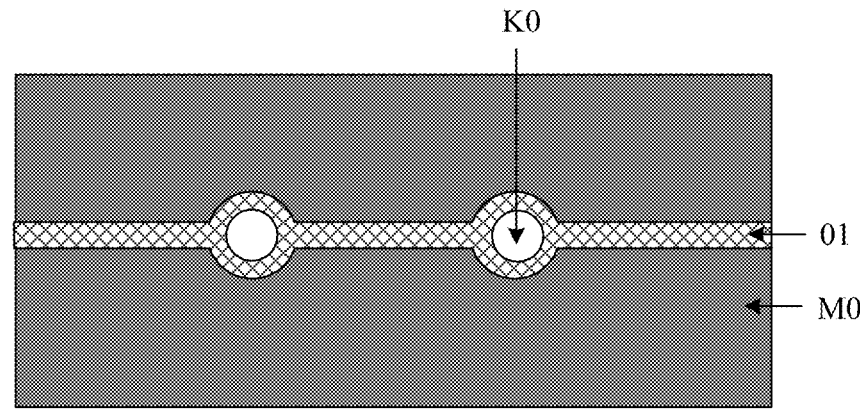
FIG. 7 is a schematic structural diagram of a silicon wafer with a photoresist pattern according to an embodiment of this disclosure.

For example, in combination with FIG. 7, a schematic structural diagram of the photoresist pattern M0 obtained after the exposure, the development, and the fixing is shown. Referring to FIG. 7, it can be seen that an orthographic projection of the photoresist pattern M0 on the silicon wafer 01 does not overlap a region where the through silicon via K0 is located, that is, the photoresist pattern M0 does not cover the through silicon via K0.

Step 405. Etch a region, not covered by the photoresist pattern, on the target surface to form a groove communicating with the through silicon via.

Figure 8:
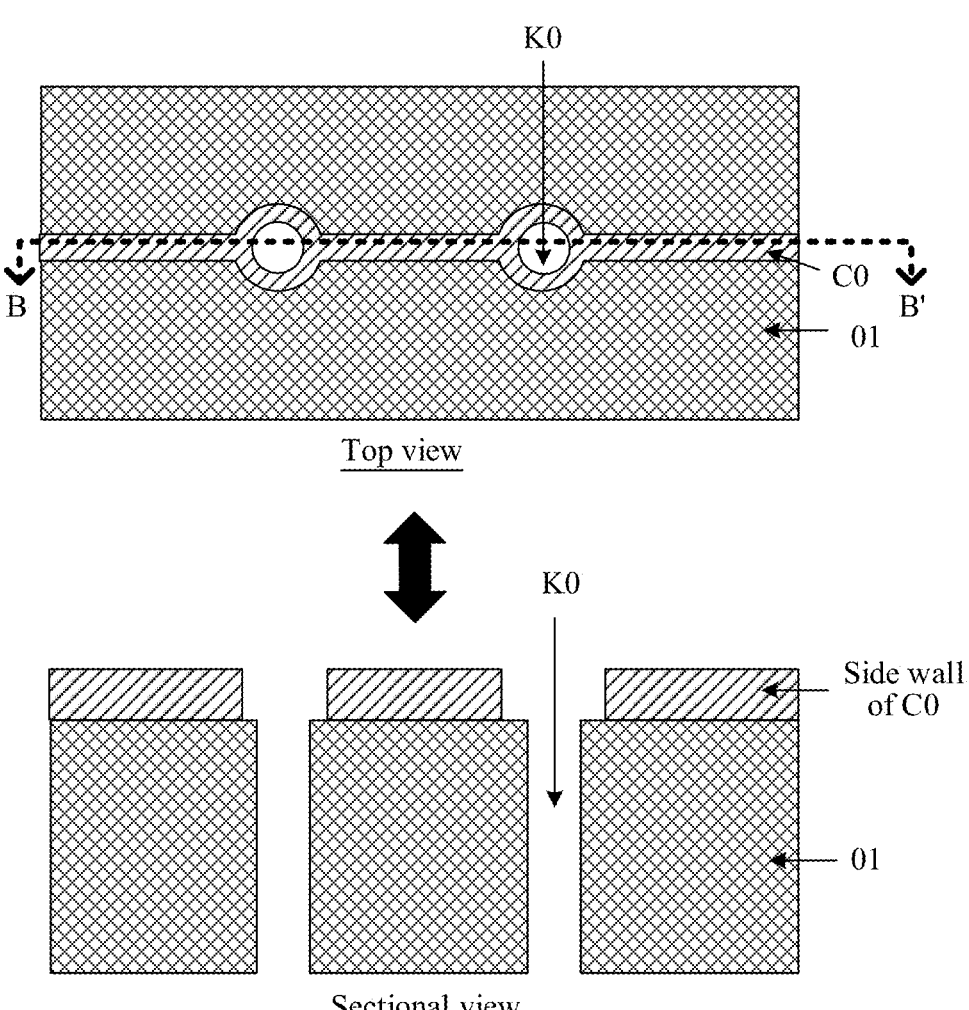
FIG. 8 is a schematic structural diagram of a silicon wafer with a groove according to an embodiment of this disclosure.

In an implementation, in this embodiment of this disclosure, in combination with the top view shown in FIG. 8 (referring to figure above the arrow in FIG. 8) and the sectional view in a direction BB' (referring to the figure below the arrow in FIG. 8), it can be seen that after the photoresist pattern M0 shown in FIG. 7 is obtained, the photoresist pattern M0 may be used as a mask, and a dry etching process is used to etch the region, not covered by the photoresist pattern M0, on the target surface of the silicon wafer 01, namely, etch the silicon wafer 01, to form the groove C0 communicating with the through silicon via K0. Afterwards, the photoresist pattern M0 may be removed. For example, acetone and a glue remover may be used to remove the photoresist pattern M0, thereby obtaining the silicon wafer 01 with the groove C0. Of course, in some other embodiments, a wet etching process may also be used to form the groove C0.

It can be understood that since the pattern of the photoresist removed during the exposure and development is the same as the pattern of the final desired circuit structure, it can be ensured that the groove C0 obtained by etching has the same shape and size as the desired circuit structure. In addition, after step 405 above, a cleaning solution such as acetone may be used to clean the silicon wafer 01 with the groove C0, and the subsequent operations are then further performed.

In an implementation, an etching depth of the region not covered by the photoresist pattern may be greater than a thickness of the superconducting thin film formed in the groove C0. Of course, the etching depth also needs to be less than a thickness of the silicon wafer 01.

For example, for a superconducting thin film made of a titanium nitride material, a usually formed thickness is about 100 nm. Correspondingly, an etching depth of the target surface of the silicon wafer 01 may be greater than 100 nm and less than 200 nm. By setting the etching depth to be less than 200 nm, it may avoid the impact of a larger etching depth on the subsequent machining processes. Of course, for superconducting thin films made of other materials, a thickness of the subsequently formed superconducting thin film may also be 200 nm. Correspondingly, an etching depth of the target surface of the silicon wafer 01 may be greater than 200 nm and less than 400 nm. Similarly, by setting the etching depth to be less than 400 nm, it may also avoid the impact of a larger etching depth on the subsequent machining processes.

In addition, it can be understood that although the through silicon via K0 will be etched to the same depth due to the absence of a photoresist around, this etching depth can be ignored compared with the thickness of the silicon wafer 01 of about 200 μm.

Step 406. Form insulation layers in the groove and the through silicon via.

In combination with FIG. 8, in this embodiment of this disclosure, after the groove C0 is formed in the silicon wafer 01 and before the superconducting thin films are formed in the groove C0 and the through silicon via K0, insulation layers may continue to be formed in the groove C0 and the through silicon via K0. Therefore, the superconducting thin films formed in the groove C0 and the through silicon via K0 can be insulated from the silicon wafer 01, effectively reducing the impact of the conductivity of the silicon wafer 01 on the superconductivity of the superconducting thin films.

For example, an insulation material (such as a silicon dioxide material) may be deposited in the groove C0 and the through silicon via K0 through the ALD process to form the insulation layers. Or, thermal oxidation treatment may be performed on the groove C0 and the through silicon via K0 to form the insulation layers in the groove C0 and the through silicon via K0. Moreover, the material of the insulation layer formed through the thermal oxidation treatment may be silicon dioxide. Of course, in some other embodiments, the insulation material may also be deposited in the groove C0 and through silicon via K0 in other ways (such as the CVD process), to form the insulation layers. In addition, only one layer of insulation layer or a plurality of layers of insulation layers may be formed in the groove and through silicon via.

Step 407. Form superconducting thin films in the groove and the through silicon via to obtain the through silicon via interconnection structure.

In combination with FIG. 9, in this embodiment of this disclosure, the silicon wafer 01 with the insulation layers may be placed in a coating chamber, and the same superconducting material may be deposited simultaneously in the groove C0 and the through silicon via K0 using the ALD deposition device in combination with the ALD process, to form the superconducting thin films 02. Of course, in some other embodiments, the superconducting material may also be deposited in the groove C0 and the through silicon via K0 through other deposition processes, to form the superconducting thin films. For example, the superconducting thin films 02 may also be formed using the CVD process. In addition, the superconducting materials deposited in the groove C0 and the through silicon via K0 may also be different.

For example, the superconducting material deposited in this embodiment of this disclosure may be a titanium nitride material, and correspondingly, the formed superconducting thin films 02 are titanium nitride thin film. When the superconducting material is the titanium nitride material, a thickness of the deposited superconducting thin film 02 may be about 100 nm. FIG. 10 is a flowchart of a method of forming a superconducting thin film according to an embodiment of this disclosure. As shown in FIG. 10, the method (namely, step 407) may include:

Step 4071. Form, on the target surface with the groove, a superconducting thin film covering the target surface, and form, in the through silicon via, a superconducting thin film covering a side wall of the through silicon via.

Figure 11:
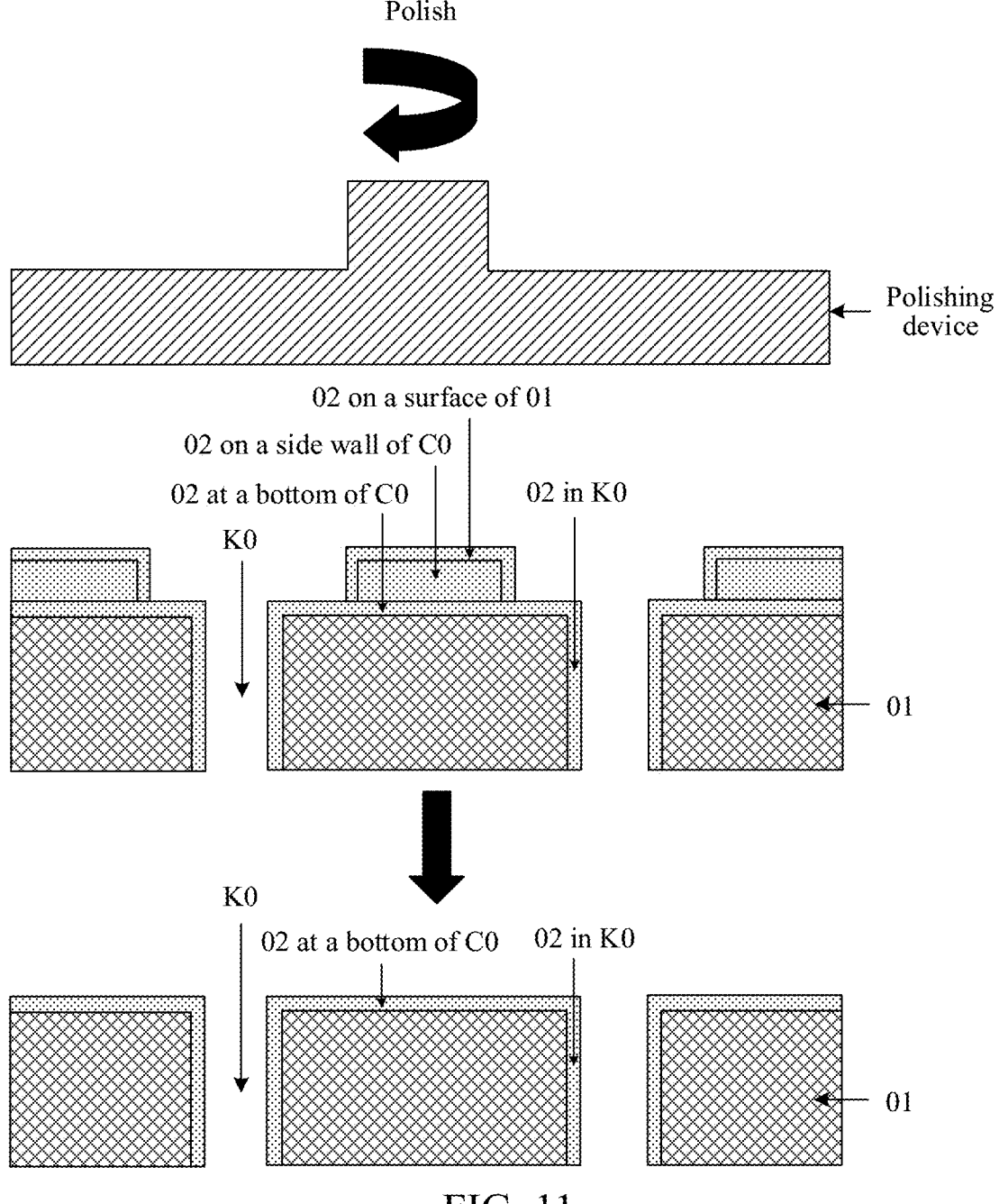
FIG. 11 is a schematic structural diagram of a polished superconducting thin film according to an embodiment of this disclosure.

In an implementation, during the formation of the superconducting thin films, in combination with FIG. 9 and FIG. 11, the superconducting thin film 02 covering the target surface may be formed on the target surface with the groove C0 through the ALD process, and the superconducting thin film 02 covering the side wall of the through silicon via K0 is formed in the through silicon via K0. Due to a good step coverage rate of the thin film deposited by the ALD process, as shown in FIG. 9 and FIG. 11, the side wall of the groove C0, a bottom of the groove C0, the surface of the silicon wafer 01, and the side wall of the through silicon via K0 can be fully deposited with the superconducting thin films 02.

Step 4072. Remove the remaining superconducting thin film on the target surface, except for the superconducting thin film at a bottom of the groove, to obtain the through silicon via interconnection structure.

Referring to FIG. 11, the target surface covered with the superconducting thin film 02 may be polished using a polishing device to remove the remaining superconducting thin film on the target surface, except for the superconducting thin film 02 at the bottom of the groove C0. A polishing removal amount of the polishing device may be: subtracting a depth of the groove C0 from a thickness of another superconducting thin film on the target surface, except for the superconducting thin film 02 at the bottom of the groove C0. From this, it can be ensured that after the polishing treatment, only the superconducting thin film 02 at the bottom of the groove C0 and the superconducting thin film 02 in the through silicon via K0 remain on the silicon wafer 01.

As recorded in the aforementioned embodiments, since the groove C0 formed by the photolithography process is the same as the desired circuit structure, a silicon wafer surface circuit structure composed of the superconducting thin films 02 can be further obtained after the polishing. Due to the fact that the above-mentioned superconducting thin films 02 are formed by synchronously depositing the same superconducting material in the groove C0 and the through silicon via K0, it can be ensured that there are no impurities or oxide layers between the finally formed circuit structure and the superconducting thin film 02 in the through silicon via K0, thereby ensuring a good connection between the circuit structure and the superconducting thin film 02 in the through silicon via K0.

It can be understood that in combination with FIG. 11, in the process of removing other superconducting thin films 02 by polishing, it is inevitable to remove part of the silicon wafer 01. Therefore, a thickness of the finally obtained through silicon via interconnection structure may be less than the thickness of the silicon wafer 01 provided.

It can also be understood that in combination with FIG. 9, based on the execution of step 406, the formation of the superconducting thin films 02 in the groove C0 and the through silicon via K0 may refer to: forming the superconducting thin films 02 on one side, far away from the silicon wafer 01, of the insulation layer in the groove C0 and on one side, far away from the silicon wafer 01, of the insulation layer in the through silicon via K0. Of course, in some other embodiments, step 406 may not be executed. That is, the superconducting thin films may be directly formed in the groove C0 and the through silicon via K0 on the basis of the structure obtained in step 405, to obtain the through silicon via interconnection structure.

Based on the above embodiments, it can be seen that this embodiment of this disclosure first forms, in the silicon wafer, the groove that is the same as the desired circuit structure, then grows the superconducting thin film in the groove, and removes the excess superconducting thin film by polishing, to obtain the through silicon via interconnection structure. Thus, the circuit structure finally formed on the surface of the silicon wafer can be reliably connected to the superconducting thin film formed in the through silicon via. Due to the fact that the above method does not perform photolithography on the superconducting thin film, the problem of a failure in connection caused by the fact that the superconducting thin film deposited near the through silicon via is etched away is avoided. Moreover, since the same deposition material can be deposited in both the groove and the through silicon via at one time to form the superconducting thin films, the problem of impurities or oxide layers between the superconducting thin film on the surface of the silicon wafer and the superconducting thin film in the through silicon via caused by a lift-off process is also avoided. Based on the above analysis, it can be seen that the through silicon via interconnection structure formed by this embodiment of this disclosure can ensure reliable interconnection of various stacked superconducting quantum chips, thereby ensuring a relatively good reliability of signal transmission between the various chips.

It can be understood that the order of the steps of the method of forming the through silicon via interconnection structure provided in the embodiments of this disclosure can be adjusted appropriately. For example, step 406 above can be deleted, that is, after the groove is formed in the silicon wafer, the superconducting thin films can be directly formed in the groove and the through silicon via. Any persons skilled in the art can easily think of changing methods within the scope of the disclosed technology in this disclosure, and these changing methods shall fall within the protection scope of this disclosure, which will not be repeated.

It can also be understood that the formation device for implementing the above formation method may include an etching device, a photolithography device, a film forming device, and the like. The film forming device may be an ALD device, a CVD device, or the like. In an implementation, the formation device may further include a thermal oxidization device, a polishing device, and the like.

To sum up, this embodiment of this disclosure provides a method of forming a through silicon via interconnection structure. The method includes: forming, in any surface of a silicon wafer with a through silicon via, a groove communicating with the through silicon via by using a photolithography process; and then forming superconducting thin films in the groove and the through silicon via, to obtain a through silicon via interconnection structure. Due to the fact that the method can first use the photolithography process to form the groove communicating with the through silicon via, and then form the superconducting thin film in the groove, there is no need to perform photolithography on the superconducting thin film subsequently. In this way, the problem that the superconducting thin film near the through silicon via is etched away because of a poor spin coating effect in the photolithography process can be avoided, thus ensuring that the superconducting thin film on the surface of the silicon wafer and used for forming a circuit structure is reliably connected to the superconducting thin film in the through silicon via.

Figures 12, 13:
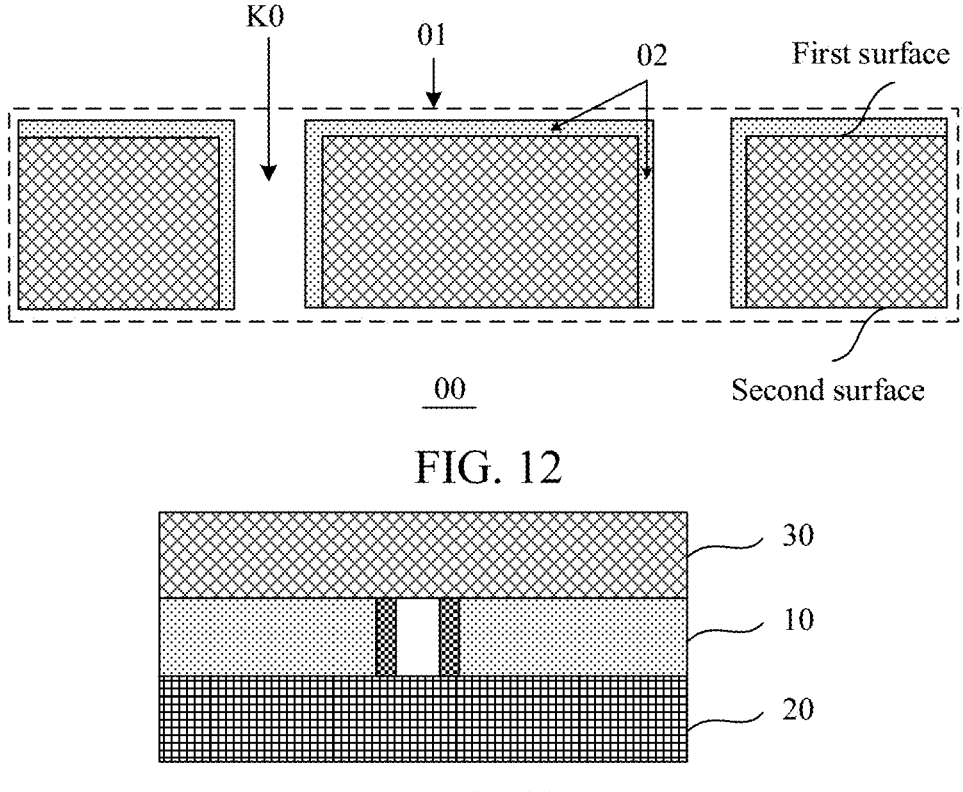
FIG. 12 is a schematic structural diagram of a through silicon via interconnection structure according to an embodiment of this disclosure.
FIG. 13 is a schematic structural diagram of a quantum computing device according to an embodiment of this disclosure.

FIG. 12 is a schematic structural diagram of a through silicon via interconnection structure according to an embodiment of this disclosure. The through silicon via interconnection structure is formed by the method provided in the above embodiment. For example, the through silicon via interconnection structure may be formed using the method shown in FIG. 3 or FIG. 4.

As shown in FIG. 12, the through silicon via interconnection structure 00 includes: a silicon wafer 01 having a first surface and a second surface opposite to each other; a through silicon via K0, penetrating through the silicon wafer 01 in a direction from the first surface to the second surface of the silicon wafer 01; a superconducting thin film 02 located in a groove C0 in a target surface of the first surface and the second surface of the silicon wafer 01; and a superconducting thin film 02 located in the through silicon via K0. The superconducting thin film 02 located in the groove C0 is used for forming a circuit structure.

It can be understood that the structure shown in FIG. 12 is a structure after the groove C0 is polished. Moreover, the through silicon via interconnection structure 00 shown in FIG. 12 only has the superconducting thin film 02 formed on the first surface.

In an implementation, a material of the superconducting thin film 02 may be a titanium nitride material, with a thickness ranging from 100 nm to 200 nm.

In this embodiment of this disclosure, the through silicon via interconnection structure 00 may also include insulation layers located in the groove C0 and the through silicon via K0, and located on sides of the superconducting thin films 02 close to the silicon wafer 01. That is, before the superconducting thin films 02 are formed, the insulation layers may be formed in the groove C0 and the through silicon via K0 first. Thus, insulation between the superconducting thin films 02 and the silicon wafer 01 can be achieved, which effectively reduces the impact of the conductivity of the silicon wafer 01 on the superconductivity of the superconducting thin films 02.

A material of the insulation layers may be silicon dioxide. Moreover, the insulation layers may be formed by depositing an insulation material through an ALD process or a CVD process, or may also be directly formed by performing thermal oxidation treatment on the groove C0 and the through silicon via K0.

FIG. 13 is a schematic structural diagram of a quantum computing device according to an embodiment of this disclosure. As shown in FIG. 13, the quantum computing device may include: a first chip 20, a second chip 30, and the through silicon via interconnection structure 00 provided in the above embodiment.

The first chip 20, the through silicon via interconnection structure 00 and the second chip 30 may be stacked in sequence, and the first chip 20 and the second chip 30 may be interconnected (i.e. connected to each other for conduction) through the through silicon via interconnection structure 00.

In an implementation, the through silicon via interconnection structure 00 may also be a chip, and is interconnected with the first chip 10 and the second chip 30 respectively. That is, the three chips may be stacked and are interconnected through the chip with a through silicon via structure in the middle.

It can be understood that FIG. 13 only schematically shows the three layers of stacked structures. The quantum computing device may also include a larger number of (namely, five) chips stacked in sequence, and the multiple chips can be interconnected through the through silicon via interconnection structure.

The "first" or "second", and similar terms used in the embodiments of this disclosure do not indicate any order, quantity or significance, but are used to only distinguish different components. Similarly, "one", "a", and similar terms also do not indicate a quantity limitation, but indicates that there is at least one.

Similar terms such as "include" and "including" mean that elements or items appearing before the term cover elements or items and their equivalents listed after the terms, but do not exclude other elements or items.

Similar terms such as "connection" are not limited to a physical or mechanical connection, but may include an electrical connection, regardless of a direct or indirect connection. Terms such as "up" or "down" are only used to represent a relative positional relationship. When an absolute position of a described object changes, the relative positional relationship may also change correspondingly.

"And/or" represents that three relationships may exist. For example, A and/or B may represent: only A exists, both A and B exist, and only B exists. The character "/" usually indicates an "or" relation between associated objects.

The foregoing descriptions are merely optional embodiments of this disclosure, but are not intended to limit this disclosure. Any modification, equivalent replacement, or improvement made within the spirit and principle of this disclosure shall fall within the protection scope of this disclosure.

What is claimed is:

1. A method of forming a through silicon via interconnection structure, the method comprising:

providing a silicon wafer, having a first surface and a second surface opposite to each other;

forming, in the silicon wafer, a through silicon via penetrating through the silicon wafer in a direction from the first surface to the second surface of the silicon wafer;

forming a groove communicating with the through silicon via in a target surface of the first surface and the second surface of the silicon wafer using a photolithography process; and forming a superconducting thin film in the groove and the through silicon via to obtain the through silicon via interconnection structure, wherein the forming the superconducting thin film comprises depositing a same superconducting material in the groove and the through silicon via to form the superconducting thin film.

2. The method according to claim 1, wherein the depositing the same superconducting material in the groove and the through silicon via comprises:

depositing the same superconducting material in the groove and the through silicon via using an atomic layer deposition process or a chemical vapor deposition process, to form the superconducting thin film.

3. The method according to claim 2, wherein the superconducting material is a titanium nitride material.

4. The method according to claim 1, wherein the forming the groove communicating with the through silicon comprises:

forming a photoresist on the target surface of the first surface and the second surface of the silicon wafer;

exposing and developing the photoresist in sequence to obtain a photoresist pattern, an orthographic projection of the photoresist pattern on the silicon wafer not overlapping with the through silicon via; and etching a region, not covered by the photoresist pattern, on the target surface to form the groove communicating with the through silicon via.

5. The method according to claim 4, wherein the etching the region on the target surface comprises:

etching the region, not covered by the photoresist pattern, on the target surface using dry etching.

6. The method according to claim 4, wherein the photoresist is a positive photoresist, and the method further comprises:

forming a circuit structure using the superconducting thin film located in the groove, and an exposed region of the positive photoresist during exposure being identical with the circuit structure in shape and size.

7. The method according to claim 4, wherein the photoresist is a negative photoresist, and the method further comprises:

forming a circuit structure using the superconducting thin film located in the groove, and an unexposed region of the negative photoresist during exposure of the negative photoresist being identical with the circuit structure in shape and size.

8. The method according to claim 4, wherein the method further comprises:

removing the photoresist pattern using acetone and a glue remover.

9. The method according to claim 1, wherein the forming the superconducting thin film in the groove and the through silicon via to obtain the through silicon via interconnection structure comprises:

forming, on the target surface, a superconducting thin film covering the target surface;

forming, in the through silicon via, a superconducting thin film covering a side wall of the through silicon via; and removing a remainder of the superconducting thin film on the target surface, except for the superconducting thin film at a bottom of the groove, to obtain the through silicon via interconnection structure.

10. The method according to claim 9, wherein the removing the remainder of the superconducting thin film on the target surface comprises:

polishing the target surface covered with the superconducting thin film to remove the remainder of the superconducting thin film on the target surface, except for the superconducting thin film at a bottom of the groove.

11. The method according to claim 1, wherein the method further comprises:

forming insulation layers in the groove and the through silicon via; and the forming the superconducting thin film in the groove and the through silicon via comprises:

forming the superconducting thin film on a side, far away from the silicon wafer, of the insulation layer in the groove and on a side, far away from the silicon wafer, of the insulation layer in the through silicon via.

12. The method according to claim 11, wherein the forming the insulation layers in the groove and the through silicon via comprises:

depositing an insulation material in the groove and the through silicon via using an atomic layer deposition process or a chemical vapor deposition process, to form the insulation layers.

13. The method according to claim 11, wherein the forming the insulation layers in the groove and the through silicon via comprises:

performing thermal oxidation treatment on the groove and the through silicon via to form the insulation layers in the groove and the through silicon via.

14. The method according to claim 11, wherein a material of the insulation layer is silicon dioxide.

15. A through silicon via interconnection structure, comprising:

a silicon wafer, having a first surface and a second surface opposite to each other;

a through silicon via, penetrating through the silicon wafer in a direction from the first surface to the second surface of the silicon wafer;

a superconducting thin film located in a groove in a target surface of the first surface and the second surface of the silicon wafer, and located in the through silicon via; and an insulation layer, located in the groove and the through silicon via, and on a side of the superconducting thin film close to the silicon wafer.

16. The through silicon via interconnection structure according to claim 15, wherein a material of the superconducting thin film is a titanium nitride material.

17. The through silicon via interconnection structure according to claim 15, wherein a material of the insulation layer is silicon dioxide.

18. A quantum computing device, comprising:

a first chip;

a second chip; and a through silicon via interconnection structure, comprising:

a silicon wafer, having a first surface and a second surface opposite to each other;

a through silicon via, penetrating through the silicon wafer in a direction from the first surface to the second surface of the silicon wafer; and a superconducting thin film located in a groove in a target surface of the first surface and the second surface of the silicon wafer, and located in the through silicon via; and the first chip, the through silicon via interconnection structure, and the second chip being stacked in sequence, and the first chip and the second chip being interconnected through the through silicon via interconnection structure.

19. The quantum computing device according to claim 18, wherein the through silicon via interconnection structure further comprises:

insulation layers, located in the groove and the through silicon via, and on a side of the superconducting thin film close to the silicon wafer.

* * * * *